United States Patent [19]

Nagashima et al.

[11] Patent Number: 5,254,430
[45] Date of Patent: Oct. 19, 1993

[54] PRESENSITIZED PLATE HAVING ANODIZED ALUMINUM SUBSTRATE, HYDROPHILIC LAYER CONTAINING PHOSPHONIC OR PHOSPHINIC COMPOUND AND PHOTOSENSITIVE LAYER CONTAINING O-QUINONE DIAZIDE COMPOUND

[75] Inventors: Akira Nagashima; Keiji Akiyama; Tadao Toyama, all of Shizuoka, Japan

[73] Assignee: Fuji Photo Film Co., Ltd., Ashigara, Japan

[21] Appl. No.: 827,452

[22] Filed: Jan. 29, 1992

[30] Foreign Application Priority Data

Jan. 31, 1991 [JP] Japan .................................. 3-10604
Mar. 12, 1991 [JP] Japan .................................. 3-46932

[51] Int. Cl.$^5$ ............................ G03F 7/11; G03F 7/30
[52] U.S. Cl. .................................... 430/166; 430/276; 430/278; 430/302; 430/326; 430/331; 430/525; 430/526
[58] Field of Search ............... 430/166, 278, 276, 302, 430/326, 331, 525, 526

[56] References Cited

U.S. PATENT DOCUMENTS 3,220,832  11/1965  Uhlig .
4,376,814   3/1983  Walls .................................... 430/272
4,427,765   1/1984  Mohr et al. .......................... 430/166
4,689,272   8/1987  Simon et al. ......................... 430/278

FOREIGN PATENT DOCUMENTS 0149490  7/1985  European Pat. Off. .

OTHER PUBLICATIONS

Patent Abstracts of Japan, vol. 9, No. 87, Apr. 17, 1985, JP-A-59,214,651.
World Patents Index Latest, Section PQ, Week 8822, JP-A-63,091,292.

Primary Examiner—Charles L. Bowers, Jr.
Assistant Examiner—Christopher G. Young
Attorney, Agent, or Firm—Burns, Doane, Swecker & Mathis

[57] ABSTRACT

A PS plate comprises an aluminum plate which is surface-roughened and then anodized so that the amount of an anodized layer formed is not less than 1.0 g/m$^2$; a hydrophilic layer which is applied onto the anodized layer and which comprises at least one compound selected from the group consisting of:

(A) substituted or unsubstituted aliphatic or aromatic phosphonic acids having one or two phosphonic acid residues in the molecule and salts thereof; and (B) substituted or unsubstituted aliphatic or aromatic phosphinic acids having one or two phosphinic acid residues in the molecule and salts thereof, wherein the substituent of the compounds (A) and (B) being at least one member selected from the group consisting of hydroxyl, alkoxy, aryloxy, carboxyl, alkyl, aryl, allyl, acyl, acyloxy, nitro and cyano groups and halogen atoms; and a layer of a positive-working light-sensitive composition formed on the hydrophilic layer.

The present PS plate can provide, after development, a lithographic printing plate which has a low degree of remaining color stain on the non-image area, is free of background contamination and shows excellent printing durability.

16 Claims, No Drawings

PRESENSITIZED PLATE HAVING ANODIZED ALUMINUM SUBSTRATE, HYDROPHILIC LAYER CONTAINING PHOSPHONIC OR PHOSPHINIC COMPOUND AND PHOTOSENSITIVE LAYER CONTAINING O-QUINONE DIAZIDE COMPOUND

BACKGROUND OF THE INVENTION

1. Field of the Invention

The present invention relates to a positive-working presensitized plate for use in making a lithographic printing plate (hereinafter referred to as a "PS plate") and more specifically to a positive-working PS plate which comprises an aluminum plate carrying an anodized layer and an improved hydrophilic layer applied onto the substrate.

2. Description of Related Art

A lithographic printing plate has conventionally been prepared by imagewise exposing, to light, a PS plate comprising an aluminum substrate provided thereon with a thin layer of a light-sensitive composition and then developing the imagewise exposed PS plate. The aluminum substrate has usually been surface-roughened by, for instance, a mechanical graining such as brush graining or ball graining; electrochemical graining such as electrolytic graining; or a combination thereof to obtain a sprinkled surface, then etched with an aqueous solution of an acid or alkali, anodized and then optionally hydrophilized to give a substrate for lithographic printing plates. A light-sensitive layer is applied onto the surface of the resulting aluminum substrate to give a PS plate. A lithographic printing plate has generally been obtained by imagewise-exposing such a PS plate to light, developing, then correcting and finally gumming up and the resulting printing plate has been fitted to a printing press to perform printing operations.

However, the non-image area of the lithographic printing plate obtained by imagewise exposing a positive-working PS plate and then developing is contaminated due to substances included in the light-sensitive layer which are irreversibly adsorbed onto the non-image area. This results in the formation of so-called remaining color stains which make it difficult to clearly distinguish the image area from the non-image area during the correction process. Further, the correction marks remain on the surface clearly and thus the surface becomes uneven. In the worst case, the correction marks become a cause of background contamination and the resulting printing plate cannot be used in printing.

To solve these problems, there have been proposed various methods, for instance, a treatment comprising immersing an anodized aluminum substrate in an alkali metal silicate solution as disclosed in U.S. Pat. No. 3,181,461; a treatment with fluorozirconate as disclosed in Japanese Examined Patent Publication (hereinafter referred to as "J. P. KOKOKU") No. Sho 36-22063; a hydrophilization treatment with polyvinylphosphonate as disclosed in U.S. Pat. No. 3,276,868; application of an underlying coating of a hydrophilic cellulose containing a water-soluble metal salt as disclosed in U.S. Pat. No. 3,860,426; application of an underlying coating of a sodium arylsulfonate as disclosed in U.K. Patent No. 2,098,627; and application of an underlying coating of polyacrylamide (U.S. Pat. No. 3,511.661). polyvinylphosphonic acid (J. P. KOKOKU No. Sho 46-35685), an amino acid or salt thereof (such as alkali metal salts, e.g., Na and K salts; ammonium salts, hydrochlorides, oxalates, acetates and phosphates) as disclosed in Japanese Unexamined Patent Publication (hereinafter referred to as "J. P. KOKAI") No. Sho 60-149491 (=U.S. Pat. No. 4,801,527), amines having hydroxyl groups and salts thereof (such as hydrochlorides, oxalates and phosphates) as disclosed in J. P. KOKAI No. Sho 60-232998 (=U.S. Pat. No. 4,801,527), or compounds having amino groups and phosphonate residues and salts thereof as disclosed in J. P. KOKAI No. Sho 63-165183. However, these methods are still insufficient in the elimination of the remaining color stains on non-image areas and accordingly the foregoing problem of "background contamination" cannot completely be eliminated. Moreover, these methods make the adhesion between a substrate and a light-sensitive layer insufficient and, therefore, there has still remained room for improvement.

SUMMARY OF THE INVENTION

Accordingly, an object of the present invention is to provide a positive-working PS plate which only slightly generates remaining color stains (i.e., the remaining of coloring components present in the light-sensitive layer) on non-image areas after developing the imagewise exposed PS plate and which can provide a lithographic printing plate having almost no retouching marks after treating with an elimination solution.

Another object of the present invention is to provide a positive-working PS plate which can provide a lithographic printing plate in which image areas are firmly adhered to an aluminum substrate and which thus has high printing durability.

The inventors of this invention have conducted intensive studies to achieve the foregoing objects and as a result have completed the present invention.

According to an aspect of the present invention, there is provided a PS plate comprising an aluminum plate which is surface-roughened and then anodized s that the amount of an anodized layer is not less than 1 10 g/m²; a hydrophilic layer which is applied onto the anodized layer and comprises at least one compound selected from the group consisting of:

(A) substituted or unsubstituted aliphatic or aromatic phosphonic acids having one or two phosphonic acid residues in the molecule and salts thereof; and (B) substituted or unsubstituted aliphatic or aromatic phosphinic acids having one or two phosphinic acid residues in the molecule and salts thereof, (the substituent in (A) and (B) being at least one member selected from the group consisting of hydroxyl, alkoxy, aryloxy, carboxyl, alkyl, aryl, allyl, acyl, acyloxy, nitro and cyano groups and halogen atoms); and a layer of a positive-working light-sensitive composition applied onto the hydrophilic layer.

According to another aspect of the present invention, there is provided a PS plate comprising an aluminum plate which is anodized and then hydrophilized; an organic layer which is applied onto the hydrophilized anodic oxide layer and comprises at least one compound selected from the group consisting of substituted or unsubstituted aliphatic or aromatic compounds represented by the general formula: $R^1(PO(OH)_2)_n$ or $R^1(PO(OH)(R^2))_n$, wherein n is 1 or 2; if n is 1, $R^1$ and $R^2$ each represents a substituted or unsubstituted alkyl, alkoxy, aryloxy, aryl, acyl or acyloxy group; and if n is 2, $R^1$ represents a substituted or unsubstituted alkylene or arylene group and $R^2$ is the same as that defined above, the substituent being at least one member selected from the group consisting of hydroxyl, carboxyl, amino, cyano and nitro groups and halogen atoms; and a positive-working light-sensitive layer which is applied onto the organic layer and comprises an o-quinone diazide compound and an organic polymer.

DESCRIPTION OF THE PREFERRED EMBODIMENTS

The present invention will hereinafter be described in detail.

The aluminum plate used in the invention is a plate-like body of pure aluminum or an aluminum-based alloy containing a trace amount of other elements such as silicon, iron, manganese, copper, magnesium, chromium, zinc, bismuth, nickel and/or titanium. The content of these trace elements are at most in the order of not more than 10% by weight. Preferred aluminum plate is a pure aluminum plate, but the production of completely pure aluminum plates are difficult due to the limit in the refining technique and thus preferred are aluminum plates whose content of the trace elements is as low as possible. The aluminum alloy having the content of the trace elements defined above can be used in the invention without any trouble. As has been discussed above, the aluminum plates usable in the invention are not limited to those having specific compositions and they can properly be selected from those conventionally known and currently used. Thus, any know and/or used aluminum materials such as JIS A1050, JIS A1100, JIS A1200, JIS A3103, JIS A3003 and JIS A3005 can be suitably used in the present invention, but the invention is not limited to specific materials. The thickness of the aluminum plate used in the invention in general ranges from about 0.1 to 0.5 mm.

The aluminum plate is optionally degreased with an aqueous solution of a surfactant or an alkali for removing any rolling oil adhered to the surface prior to surface-roughening treatment.

The PS plate of the present invention may be either one-sided or double-sided. For the sake of simplicity, the present invention will hereinafter be described with reference to the one-sided PS plate.

The aluminum plate is first of all surface-roughened. The surface-roughening treatment can be performed by a mechanical or electrochemical surface-roughening treatment or by selectively and chemically dissolving the surface. As the mechanical surface-roughening treatment, there may be used, for instance, those commonly employed such as ball graining, brush graining, blast graining and buff graining. Examples of electrochemical surface-roughening treatments are those in which a DC or AC current, preferably AC current, is passed through an aluminum plate in an electrolyte such as a hydrochloric acid or nitric acid solution. In addition, it is also possible to use a combination of these two methods as disclosed in J. P. KOKAI No. Sho 54-63902 and U.S. Pat. Nos. 4,476,006 and 4,477,317.

The aluminum plate is optionally subjected to an alkali etching and neutralization treatments prior to or after the surface-roughening treatment such as disclosed in U.S. Pat. Nos. 3,834,998, 4,476,006 and 4,824,757.

In the anodization treatment of the aluminum plate, any eletrolyte may be used so far as it can form a porous anodized layer and generally used are, for instance, sulfuric acid, phosphoric acid, oxalic acid, chromic acid and mixture thereof. The concentration of these electrolytes is properly selected depending on the kinds of electrolytes used.

The conditions for the anodization variously vary depending on the kinds of electrolytes used, but are in general an electrolyte concentration ranging from 1 to 80% by weight, an electrolyte temperature ranging from 5° to 70° C., a current density ranging from 5 to 60 A/dm$^2$, an electric voltage ranging from 1 to 100 V, and an electrolysis time of from 10 seconds to 50 minutes.

Preferred is anodization using sulfuric acid as an electrolyte, especially under the conditions as disclosed in British Patent No. 1,412,768 or U.S. Pat. No. 4,211,619.

Most preferred is anodization using an electrolyte comprising from 5 to 20% by weight of sulfuric acid and from 3 to 15% by weight of aluminum ions at a temperature of from 25° to 50° C. with a direct current having a current density of from 5 to 20 A/dm$^2$.

The amount of the anodized layer to be formed is preferably not less than 1.0 g/m$^2$ and more preferably 2.0 to 6.0 g/m$^2$. This is because, if it is less than 1.0 g/m$^2$, the resulting lithographic printing plate has insufficient printing durability and the non-image area of the printing plate is easily damaged. Thus, adhesion of ink to the defects, so-called "defect stains" are liable to occur.

After the foregoing treatments, the aluminum plate may further be subjected to any other hydrophilization treatments. Such hydrophilization treatments may be those conventionally known.

A hydrophilic layer comprising the following hydrophilic compound is applied onto the anodized layer of the aluminum plate thus treated according to a variety of methods as will be detailed below.

The hydrophilic compound used in the invention is at least one member selected from the group consisting of:
(A) substituted or unsubstituted aliphatic or aromatic phosphonic acids having one or two phosphonic acid residues in the molecule and salts thereof; and
(B) substituted or unsubstituted aliphatic or aromatic phosphinic acids having one or two phosphinic acid residues in the molecule and salts thereof, The substituents in (A) and (B) are at least one member selected from the group consisting of hydroxyl, alkoxy, aryloxy, carboxyl, alkyl, aryl, allyl, acyl, acyloxy, nitro and cyano groups and halogen atoms).

In this respect., the substituted or unsubstituted aliphatic or aromatic phosphonic acids having one or two phosphonic acid residues in the molecule are those represented by the following general formula:

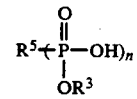

and the substituted or unsubstituted aliphatic or aromatic phosphinic acids having one or two phosphinic acid residues in the molecule are those represented by the following general formula:

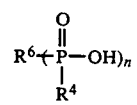

wherein $R^3$ and $R^4$ each represents a hydrogen atom, a substituted or unsubstituted alkyl group having 1 to 8 carbon atoms or a substituted or unsubstituted aryl group having 6 to 14 carbon atoms; n is 1 or 2; if n is 1, $R^5$ and $R^6$ each represents a substituted or unsubstituted alkyl or aryl group and if n is 2, $R^5$ and $R^6$ each represents a substituted or unsubstituted alkylene or arylene group.

As to the substituent for the compounds of groups (A) and (B), examples of alkoxy groups are methoxy, ethoxy, n-propoxy and n-butoxy groups; examples of aryloxy groups are phenoxy, p-chlorophenoxy and p-methylphenoxy groups; examples of alkyl groups are methyl, ethyl, n-propyl, i-propyl and n-butyl groups; examples of aryl groups are phenyl, o-, m- and p-tolyl and p-chlorophenyl groups; examples of acyl groups are formyl, acetyl, propionyl and benzoyl groups; examples of acyloxy groups are acetoxy, propionyloxy and pivaloyloxy groups; and examples of halogen atoms are fluorine, chlorine, bromine and iodine atoms.

Examples of salts of these phosphonic and phosphinic acids are alkali metal salts such as potassium, sodium and lithium salts; polyvalent metal salts such as calcium, cobalt, iron (di- and trivalent), nickel, manganese, magnesium, barium, copper and strontium salts; and ammonium salts such as tetramethylammonium salts.

Among the hydrophilic compounds usable in the invention, preferred are aliphatic or aromatic phosphonic and phosphinic acids having one phosphonic or phosphinic acid residue in the molecule and specific examples thereof include phosphonic acids such as phenylphosphonic acid, p-nitrophenylphosphonic acid, p-methoxyphenylphosphonic acid, p-hydroxyphenylphosphonic acid, p-tolylphosphonic acid, p-acetylphenylphos phonic acid, p-cyanophenylphosphonic acid, m-chlorophenylphosphonic acid, methylphosphonic acid, ethylphosphonic acid, 2-carboxyethylphosphonic acid, 2-phenylethylphosphonic acid, 2-hydroxyethylphosphonic acid, 2-methoxyethylphosphonic acid, 2-acetylethylphosphonic acid, 2-chloroethylphosphonic acid, naphthylphosphonic acid, glycerophosphonic acid, methylenediphosphonic acid, ethylenediphosphonic acid, phosphonoacetic acid, 1-hydroxyethane-1,1-diphosphonic acid and glycine-N,N-bis(methylene phosphonic acid); phosphinic acids such as phenylphosphinic acid, p-nitrophenylphosphinic acid, p-methoxyphenylpho sphinic acid, p-hydroxyphenylphosphinic acid, p-tolylphosphinic acid, p-acetylphenylphosphinic acid, p-cyanophenylphosphinic acid, m-chlorophenylphosphinic acid, methylphosphinic acid, ethylphosphinic acid, 2-carboxyethylphosphinic acid, 2-phenylethylphosphinic acid, 2-hydroxyethylphosphinic acid, 2-methoxyethylphosphinic acid, 2-acetylethylphosphinic acid, 2 chloroethylphosphinic acid, dimethylphosphinic acid, diethylphosphinic acid, diphenylphosphinic acid and naphthylphosphinic acid.

The foregoing compounds may be used alone or in any combination. Among these, particularly preferred are phenyl phosphonic acid, naphthyl phosphonic acid, phenyl phosphinic acid, diphenyl phosphinic acid and naphthyl phosphinic acid.

Among these compounds, most preferred are phenyl phosphonic acid and phenyl phosphinic acid. This is because they do not deteriorate the printing durability of the resulting lithographic printing plate and rather improve the durability, which has not been predicted at all.

The hydrophilic layer can be applied by a method comprising dissolving the foregoing hydrophilic compounds in a solvent such as water, organic solvents (e.g., methanol and ethanol) or a mixture thereof to give a coating solution, then applying the solution onto an aluminum plate anodized as has been discussed above and drying; or a method comprising immersing the anodized aluminum plate in such a coating solution to adsorb the hydrophilic compound onto the plate, then washing with, for instance, water and drying. In the former, a coating solution of the hydrophilic compound having a concentration ranging from 0.005 to 10% by weight is applied in a variety of methods such as bar coater coating, coating by a whirler, spray coating or curtain coating. In the latter method, the concentration of the coating solution ranges from 0.01 to 20% by weight, preferably 0.05 to 5% by weight; the immersion temperature ranges from 20° to 90° C., preferably 25° to 50° C.; and the immersion time ranges from 0.1 seconds to 20 minutes, preferably 2 seconds to 1 minute.

The amount of the hydrophilic layer to be applied ranges from 2 to 200 mg/m$^2$, preferably 5 to 100 mg/m$^2$ and more preferably 10 to 60 mg/m$^2$ (weighed after drying). This is because, effects such as that for preventing contamination of non-image areas are gradually impaired as the coated amount thereof is reduced to less than 2 mg/m$^2$, while if it exceeds 200 mg/m$^2$, the adhesion of the light-sensitive layer to the substrate is deteriorated and this accordingly leads to the formation of only lithographic printing plates having low printing durability.

The pH value of the coating solution used for the application of the hydrophilic layer may be controlled to 1 to 12 by addition of a basic substance such as ammonia, triethylamine or potassium hydroxide or an acid such as hydrochloric acid or phosphoric acid. Further, the coating solution may optionally comprise a yellow dye for improving the tone reproduction of the resulting PS plate.

The hydrophilic layer used in the invention may further comprise other known hydrophilic compounds such as carboxymethyl cellulose, dextrin, gum arabic, phosphonic acids having amino groups (e.g., 2-aminoethyl phosphonic acid), amino acids (e.g., glycine or β-alanine) and amine hydrochlorides having hydroxyl groups (e.g., triethanolamine hydrochloride). The hydrophilic layer desirably comprises the foregoing hydrophilic compound of the invention in an amount of preferably at least 30% by weight, more preferably not less than 80% by weight and most preferably 100% by weight.

In another embodiment of the present invention, after an aluminum plate is anodized as has been discussed above and then subjected to a hydrophilization treatment, an organic layer is applied onto the plate. The organic layer comprises at least one compound selected from the group consisting of substituted or unsubstituted aliphatic or aromatic compounds represented by the general formula: $R^1(PO(OH)_2)_n$ or $R^1(PO(OH)(R^2))_n$, wherein n is 1 or 2; if n is 1, $R^1$ and $R^2$ each independently represents a substituted or unsubstituted alkyl, alkoxy, aryloxy, aryl, acyl or acyloxy group; and if n is 2, $R^1$ represents a substituted or unsubstituted alkylene or arylene group and $R^2$ is the same as that defined above.

The foregoing hydrophilization treatment may, for instance, be a treatment with an alkali metal silicate (such as an aqueous solution of sodium silicate) as disclosed in U.S. Pat. Nos. 2,714,066; 3,181,461; 3,280,734 and 3,902,734. In this treatment, the substrate is immersed or electrolyzed in an aqueous sodium silicate solution. It is also possible to adopt a treatment with potassium fluorozirconate as disclosed in J. P. KOKOKU No. Sho 36-22063, or a treatment with a polyvinylphosphonic acid as disclosed in U.S. Pat. Nos. 3,276,868; 4,153,461 and 4,689,272. Among these, particularly preferred hydrophilization treatment is the treatment with an alkali metal silicate.

After such hydrophilization treatments, the above-described organic layer is applied onto the aluminum plate in a variety of methods.

The compounds used in the invention are (I) substituted or unsubstituted aliphatic or aromatic compounds represented by the general formula: $R^1(PO(OH)_2)_n$ (n is 1 or 2); and (II) substituted or unsubstituted aliphatic or aromatic compounds represented by the general formula: $R^1(PO(OH)(R^2))_n$ (n is 1 or 2), wherein if n is 1, $R^1$ and $R^2$ each represents a substituted or unsubstituted alkyl (preferably having 1 to 14 carbon atoms), alkoxy (preferably having 1 to 14 carbon atoms), aryloxy (preferably having 6 to 10 carbon atoms), aryl (preferably having 6 to 10 carbon atoms), acyl (preferably having 1 to 14 carbon atoms) or acyloxy (preferably having 1 to 14 carbon atoms) group; and if n is 2, $R^1$ represents a substituted or unsubstituted alkylene (preferably having 1 to 14 carbon atoms) or arylene (preferably having 6 to 10 carbon atoms) group and $R^2$ is the same as that defined above, the substituent being at least one member selected from the group consisting of alkyl (only for the aryl groups), aryl (only for the alkyl groups), alkoxy, acyl, acyloxy, aryloxy, vinyl, hydroxyl, carboxyl, cyano and nitro groups and halogen atoms.

Examples of aryloxy groups are phenoxy, p-chlorophenoxy and p-methylphenoxy groups; examples of aryl groups are phenyl, o-, m- and p-tolyl and p-chlorophenyl groups; examples of acyl groups are formyl, acetyl, propionyl and benzoyl groups; and examples of acyloxy groups are acetoxy, propionyloxy and pivaloyloxy groups. The compounds of Formulae (I) and (II) may be used in the form of salts thereof. These salts are, for instance, alkali metal salts such as potassium, sodium and lithium salts; other salts such as calcium, cobalt, iron, nickel, manganese, magnesium, barium and copper salts.

Specific examples of these compounds (I) and (II) are as follows.

The compounds of Formula (I) include, for instance, phenylphosphonic acid, phenylphosphate, naphthylphosphonic acid, naphthylphosphate, glycerophosphonic acid, glycerophosphate, p-nitrophenylphosphonic acid, p-nitrophenylphate, p-methoxyphenylphosphonic acid, p-methoxyphenylphosphate, p-hydroxyphenylphosphonic acid, p-hydroxyphenylphosphate, p-tolylphosphonic acid, p-tolylphosphate, p-acetylphenylphosphonic acid, p-acetylphenylphosphate, p-cyanophenylphosphonic acid, p-cyanophenylphosphate, m-chlorophenylphosphonic acid, m-chlorophenylphosphate, methylphosphonic acid, methylenediphosphonic acid, ethylphosphonic acid, ethylenediphosphonic acid, 2-carboxyethylphosphonic acid, phosphonoacetic acid, 2-phenylethylphosphonic acid, 2-hydroxyethylphosphonic acid, 1-hydroxyethane-1,1-diphosphonic acid, aminohexylphosphosphate, 2-methoxyethylphosphonic acid, 2-acetylethylphosphonic acid, glycine-N,N-bis(methylenephosphonic acid), phosphoserine, phosphothreonine and pyridoxal phosphate.

The compounds of Formula (II) includes, for instance, phenylphosphinic acid, naphthylphosphinic acid, diphenylphosphinic acid, dimethylphosphinic acid, p-nitrophenylphosphinic acid, p-methoxyphenylphosphinic acid, p-hydroxyphenylphosphinic acid, p-tolylphosphinic acid, p-acetylphenylphosphinic acid, bisnitrophenylphosphate, dioctyl phosphate, diisopropyl phosphate, dibutyl phosphate, dimethyl phosphate, diethyl phosphate, di-2-ethylhexyl phosphate, diphenyl phosphate, methylphosphinic acid, ethylphosphinic acid, diethylphosphinic acid, 2-carboxyethylphosphinic acid, 2-phenylethylphosphinic acid, 2-hydroxyethylphosphinic acid, 2-methoxyethylphosphinic acid and 2-acetylethylphosphinic acid.

These compounds may be used alone or in combination. Among these, preferred are phenylphosphonic acid, phenylphosphate, naphthylphosphonic acid, naphthylphosphate, phenylphosphinic acid, diphenylphosphinic acid and naphthylphosphinic acid.

The organic layer in this embodiment may be applied in the same manner discussed above in connection with the foregoing hydrophilic layer. The organic layer may comprise known hydrophilic compounds like the hydrophilic layer.

Then a light-sensitive layer comprising a known positive working light sensitive composition is applied onto the resulting anodized aluminum plate to which a hydrophilic compound has been applied or the anodized aluminum plate which has been hydrophilized and then coated with an organic layer to give a PS plate.

The foregoing light-sensitive layer may be formed from any light-sensitive composition whose solubility in or swellability with a developer is changed before and after imagewise exposure to light. Typical examples thereof will be discussed below.

The light-sensitive compounds used in positive-working light-sensitive compositions are, for instance, o-quinone diazide compounds whose typical examples are o-naphthoquinone diazide compounds.

Preferred o-naphthoquinone diazide compounds are esters of 1,2-diazonaphthoquinone sulfonic acid chloride with pyrogallol-acetone resins as disclosed in U.S. Pat. No. 3,635,709. Examples of other preferred o-quinone diazide compounds are esters of 1,2-diazonaphthoquinone-5-sulfonic acid chloride with phenol-formaldehyde resins as disclosed in U.S. Pat. Nos. 3,046,120 and 3,188,210; esters of 1,2-diazonaphthoquinone-4-sulfonic acid chloride with phenol-formaldehyde resins as disclosed in J. P. KOKAI No. Hei 2-96163, Hei 2-96165 and Hei 2-96761; and those disclosed in a variety of patents such as J. P. KOKAI Nos. Sho 47 5303, Sho 48-63802, Sho 48-63803, Sho 48-96575, Sho 49-38701 and Sho 48-13354, J. P. KOKOKU Nos. Sho 37-18015, Sho 41-11222, Sho 45-9610 and Sho 49-17481, U.S. Pat. Nos. 2,797,213; 3,454,400; 3,544,323; 3,573,917; 3,674,495 and 3,785,825, U.K. Patent Nos. 1,227,602; 1,251,345; 1,267,005; 1,329,888 and 1,330,932 and German Patent No. 854,890.

Particularly preferred o-naphthoquinone diazide compounds in the present invention are reaction products of polyhydroxy compounds having a molecular weight of not more than 1,000 with 1,2-diazonaphthoquinonesulfonic acid chloride. Specific examples thereof are those disclosed in, for instance, J. P. KOKAI Nos. Sho 51 139402, Sho 58-150948, Sho 58-203434, Sho 59-165053, Sho 60-121445, Sho 60-134235, Sho 60-163043, Sho 61-118744, Sho 62-10645, Sho 62-10646, Sho 62-153950, Sho 62-178562 and Sho 64-76047, and U.S. Pat. Nos. 3,102,809; 3,126,281; 3,130,047; 3,148,983; 3,184,310; 3,188,210 and 4,639,406.

When synthesizing these o-naphthoquinone diazide compounds, polyhydroxy compounds are preferably reacted with 1,2 diazonaphthoquinone sulfonic acid chlorides in an amount of 0.2 to 1.2 eq., more preferably 0.3 to 1.0 eq. per unit equivalent of the hydroxyl groups of the polyhydroxy compounds. As 1,2-diazonaphthoquinonesulfonic acid chlorides, there may be used, for instance, 1,2-diazonaphthoquinone-5-sulfonic acid chloride or 1,2-diazonaphthoquinone-4-sulfonic acid chloride.

The o-naphthoquinone diazide compound thus obtained is a mixture of those compounds which differ in the positions of 1,2-diazonaphthoquinone sulfonic acid ester groups as well as the quantities thereof introduced, but preferred are those in which the rate of the component whose hydroxyl groups are completely substituted with the 1,2-diazonaphthoquinone sulfonic acid ester groups (completely esterified component) is not less than 5 mole% and more preferably is 20 to 99 mole %.

It is also possible to use positive-working light-sensitive compounds other than the o-naphthoquinone diazide compounds, such as polymeric compounds having o-nitrocarbinol ester groups described in, for instance, J. P. KOKOKU No. Sho 56-2696.

In addition, there may be used, in the present invention, a combination of a compound which generates an acid through photolysis with a compound having a group: —C—O—C or —C—O—Si which can be decomposed by the action of an acid.

Examples thereof include combinations of a compound which photolytically generates an acid with an acetal or O,N-acetal compound as disclosed in U.S. Pat. No. 3,779,778, an orthoester or amidoacetal compound as disclosed in U.S. Pat. No. 4,101,323, a polymer having acetal or ketal groups in the main chain as disclosed in U.S. Pat. No. 4,247,611, an enol ether compound as disclosed in U.S. Pat. No. 4,248,957 an N acyliminocarbon compound as disclosed in U.S. Pat. No. 4,250,247, a polymer having orthoester groups in the main chain as disclosed in U S. Pat. No. 4,311,782, a silyl ester compound as disclosed in U.S. Pat. No. 4,752,552 or a silyl ether compound as disclosed in U.S. Pat. No. 4,816,375.

The amount of these positive-working light-sensitive compounds (inclusive of the foregoing combinations) in the light-sensitive composition used in the invention preferably ranges from 10 to 50% by weight and more preferably 15 to 40% by weight on the basis of the total weight of the composition.

The o-quinone diazide compound alone can form a light-sensitive layer, but is preferably used in combination with a resin soluble in an alkaline water as a binder. Such an alkaline water-soluble resin is, for instance, alkaline water-soluble novolak resins and examples thereof include phenol-formaldehyde resins and cresol-formaldehyde resins such as m-cresol-formaldehyde resins, p-cresol-formaldehyde resins, o-cresol-formaldehyde resins, m-/p-(mixed)cresol-formaldehyde resins and phenol/cresol (m-/ p-/ o- or m-/p- or m-/o- mixed cresol)-formaldehyde resins. Other preferred examples include resol type phenol resins, preferably phenol/cresol (m-/ p-/ o- or m-/p- or m-/o- mixed cresol)-formaldehyde resins and in particular phenol resins as disclosed in J. P. KOKAI No. Sho 61-217034.

Moreover, other various alkali soluble polymeric compounds may likewise be used, which include, for instance, phenol-modified xylene resins, polyhydroxystyrene, halogenated polyhydroxystyrene, acrylic resins having phenolic hydroxyl groups as disclosed in J. P. KOKAI No. Sho 51-34711, acrylic resins having sulfonamido groups as disclosed in J. P. KOKAI No. Hei 2 866 (=EP-A0330239), and urethane resins. These alkali-soluble polymers preferably have weight-average molecular weights ranging from 500 to 20,000 and number-average molecular weights ranging from 200 to 60,000.

These alkali-soluble polymers may be used alone or in any combination and the amount thereof ranges from 50 to 80% by weight on the basis of the total weight of the composition.

Other preferred binders usable in the present invention are, for instance, copolymers having repeating units derived from the following monomers (1) to (13) and generally have molecular weights ranging from 10,000 to 200,000.

(1) acrylamides, acrylates, methacrylates and hydroxystyrenes having aromatic hydroxyl groups such as N-(4-hydroxyphenyl)(meth)acrylamide, o-, m- or p-hydroxystyrene, and o-, m- or p-hydroxyphenyl (meth)acrylate;

(2) (meth)acrylates having aliphatic hydroxyl groups such as 2-hydroxyethyl (meth)acrylate;

(3) unsaturated carboxylic acids such as (meth)acrylic acid, maleic anhydride and itaconic acid;

(4) (substituted) alkyl acrylates such as methyl acrylate, ethyl acrylate, propyl acrylate, butyl acrylate, amyl acrylate, hexyl acrylate, octyl acrylate, 2-chloroethyl acrylate, glycidyl acrylate and N-dimethylaminoethyl acrylate;

(5) (substituted) alkyl methacrylates such as methyl methacrylate, ethyl methacrylate, propyl methacrylate, butyl methacrylate, amyl methacrylate, cyclohexyl methacrylate, 4-hydroxybutyl methacrylate, glycidyl methacrylate and N-dimethylaminoethyl methacrylate;

(6) (meth)acrylamides such as (meth)acrylamide, N-methylol (meth) acrylamide, N-ethylacrylamide, N-hexylmethacrylamide, N-cyclohexylacryl amide, N-hydroxyethylacrylamide, N-phenylacrylamide, N-nitrophenylacrylamide and N-ethyl-N-phenylacrylamide;

(7) vinyl ethers such as ethyl vinyl ether, 2-chloroethyl vinyl ether, hydroxyethyl vinyl ether, propyl vinyl ether, butyl vinyl ether, octyl vinyl ether and phenyl vinyl ether;

(8) vinyl esters such as vinyl acetate, vinyl chloroacetate, vinyl butylate and vinyl benzoate;

(9) styrenes such as styrene, α-methylstyrene and chloromethylstyrene;

(10) vinyl ketones such as methyl vinyl ketone, ethyl vinyl ketone, propyl vinyl ketone and phenyl vinyl ketone;

(11) olefins such as ethylene, propylene, isobutylene, butadiene and isoprene;

(12) N-vinyl pyrrolidone, N-vinyl carbazole, 4-vinyl pyridine, acrylonitrile and methacrylonitrile;

(13) unsaturated sulfonamides, for instance, (meth)acrylamides such as N-(o-aminosulfonylphenyl) (meth)acrylamide, N-(m-aminosulfonylphenyl) (meth)acrylamide, N-(p-aminosulfonylphenyl) (meth- )acrylamide, N-(1-(3-aminosulfonyl)naphthyl) (meth-)acrylamide and N-(2-aminosulfonylethyl) (meth)acrylamide; and (meth)acrylates such as o-aminosulfonylphenyl (meth)acrylate, m-aminosulfonylphenyl (meth)acrylate, p-aminosulfonylphenyl (meth)acrylate and 1-(3-aminosulfonyl)naphthyl (meth)acrylate.

The foregoing monomers may be copolymerized with other monomers copolymerizable therewith. Further, binders usable in the invention also include the copolymers obtained by copolymerizing the foregoing monomers which are further modified with, for instance, glycidyl (meth) acrylate, but the present invention is by no means limited to these specific binders.

The foregoing copolymers preferably comprise repeating units derived from the unsaturated carboxylic acids (3) listed above and the carboxylic acid value thereof preferably ranges from 0 to 3 meq/g, more preferably 0.5 to 2.5 meq/g.

The aforementioned copolymers preferably have molecular weights ranging from 10,000 to 100,000.

These copolymers may optionally comprise other polymers selected from the group consisting of polyvinyl butyral resins, polyurethane resins, polyamide resins and epoxy resins.

These alkali-soluble polymers may be used alone or in any combination and they are used in an amount of not more than 80% by weight on the basis of the total weight of the composition.

Moreover, it is preferred to simultaneously use a condensate of a phenol carrying, as a substituent, an alkyl group having 3 to 8 carbon atoms with formaldehyde such as t-butylphenol/formaldehyde resins and octylphenol/formaldehyde resins as disclosed in U.S. Pat. No. 4,123,279 for the improvement of the ink receptivity of the resulting images.

The light-sensitive composition used in the invention preferably comprises cyclic acid anhydrides, phenols and/or organic acids for enhancing the sensitivity thereof.

Examples of such cyclic acid anhydrides are phthalic anhydride, tetrahydrophthalic anhydride, hexahydrophthalic anhydride, 3,6-endoxy $\Delta^4$-tetrahydrophthalic anhydride, tetrachlorophthalic anhydride, maleic anhydride, chloromaleic anhydride, α-phenylmaleic anhydride, succinic anhydride and pyromellitic anhydride as disclosed in U.S. Pat. No 4,115,128.

Examples of phenols include bisphenol A, p nitrophenol, p-ethoxyphenol, 2,3,4-trihydroxybenzophenone, 4-hydroxybenzophenone, 2,4,4'-trihydroxybenzophenone, 4,4,4"-trihydroxy-triphenylmethane and 4,4',3",4"-tetrahydroxy-3,5,3',5'-tetramethyltriphenylmethane.

Organic acids are, for instance, sulfonic acids, sulfinic acids, alkylsulfuric acids, phosphonic acids, phosphinic acids, phosphoric acid esters and carboxylic acids as disclosed in J. P. KOKAI Nos. Sho 60-88942 and Hei 2-96755. Specific examples thereof are p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluylic acid, 3,4-dimethoxybenzoic acid, phthalic acid, terephthalic acid, 1,4-cyclohexene-2,2-dicarboxylic acid, erucic acid, lauric acid, n-undecanoic acid and ascorbic acid.

The amount of the cyclic acid anhydrides, phenols and/or organic acids to be added to the light-sensitive composition preferably ranges from 0.05 to 15% by weight and more preferably 0.1 to 5% by weight on the basis of the total weight of the composition.

The light-sensitive composition herein used may comprise, for the purpose of extending the development latitude thereof, a nonionic surfactant as disclosed in J. P. KOKAI Nos. Sho 62-251740 and Hei 2-181248 and/or an amphoteric surfactant as disclosed in J. P. KOKAI Nos. Sho 59-121044 and Hei 2-115992.

Specific examples of nonionic surfactants are sorbitan tristearate, sorbitan monopalmitate, sorbitan trioleate, stearyl monoglyceride, polyoxyethylenesorbitan monooleate and polyoxyethylene nonylphenyl ether; specific examples of amphoteric surfactants are alkyldi(aminoethyl)glycine, alkylpolyaminoethylglycine hydrochloride, Amorgen K (trade name of an N-tetradecyl-N,N-betaine type one available from Daiichi Kogyo Seiyaku Co., Ltd.), 2-alkyl-N-carboxyethyl N-hydroxyethyl imidazolinium betaine and Lebon 15 (trade name of an alkylimidazoline type one available from Sanyo Chemical Industries, Ltd.).

The nonionic and/or amphoteric surfactants are preferably used in the light-sensitive composition in an amount of 0.05 to 15% by weight and more preferably 0.1 to 5% by weight on the basis of the total weight of the composition.

The light-sensitive composition herein used may comprise a printing out agent for obtaining visible images immediately after imagewise exposure to light, a dye as an agent for coloring images and other fillers.

The printing out agents are combinations of light-sensitive compounds capable of releasing acids through exposure to light and salt-forming organic dyes. Specific examples thereof are combinations of o-naphthoquinonediazido-4-sulfonic acid halogenides with salt-forming organic dyes as disclosed in U.S. Pat. No. 3,969,118 and Sho 53-8128; and combinations of trihalomethyl compounds with salt forming organic dyes as disclosed in J. P. KOKAI Nos. Sho 60-3626, Sho 61-143748 and Sho 61-151644 and U.S. Pat. Nos. 4,160,671; 4,232,106 and 5,064,741.

Such trihalomethyl compounds include oxadiazole type and triazine type compounds both of which are stable over a long time period and can provide clear printed out images. The formation of remaning color stains due to a developer is substantially reduced in particular in a PS plate whose aluminum plate has an anodized layer of not less than 1.0 g/m$^2$. Therefore, the present invention is particularly effective when the light-sensitive composition containing such a compound is used and can provide a lithographic printing plate having almost no remaining color stains.

In addition to the foregoing salt-forming organic dyes, other dyes may be used in the invention. Preferred dyes (inclusive of the salt-forming organic dyes) are, for instance, oil-soluble dyes and basic dyes. Specific examples thereof include Oil Yellow #101. Oil Yellow #130, Oil Pink #312, Oil Green BG, Oil Blue BOS, Oil Blue #603, Oil Black BY, Oil Black BS, Oil Black T-505 (these are all available from Orient Chemical Industries Co., Ltd.); victoria Pure Blue, Crystal Violet (CI 42555), Ethyl Violet (CI 42600), Methyl Violet (CI 42535), Rhodamine B (CI 45170B), Malachite Green (CI 42000) and Methylene Blue (CI 52015). Particularly preferred dyes are those disclosed in British Patent GB-A 2,192,729, U.S. Pat. No. 4,458,000, German Patent DE-A 2229365 and EP-A 0419095.

The light-sensitive composition is dissolved in a solvent capable of solubilizing the foregoing components and then applied onto a substrate. Examples of such solvents are ethylene dichloride, cyclohexanone, methyl ethyl ketone, ethylene glycol monomethyl ether, ethylene glycol monoethyl ether, 2-methoxyethyl acetate, 1-methoxy 2-propanol, 1-methoxy-2-propyl acetate, toluene, ethyl acetate, methyl lactate, ethyl lactate, dimethylsulfoxide, dimethylacetamide, dimethylformamide, water, N-methylpyrrolidone, tetrahydrofurfuryl alcohol, acetone, diacetone alcohol, methanol, ethanol, isopropanol and diethylene glycol dimethyl ether, which may be used alone or in combination. Particularly preferred coating solvents are solvent mixtures disclosed in U.S. Pat. No. 4,845,008. The concentration of the foregoing components (solid contents) in the coating solution ranges from 2 to 50% by weight. The amount of the coating solution to be applied varies depending on applications, but preferably ranges from 0.5 to 3.0 9/m$^2$ (in terms of solid content) for PS plates. The thinner the light-sensitive layer, the higher the light-sensitivity, but the lower the physical properties of the resulting light-sensitive layer.

The light-sensitive composition used herein may comprise a surfactant for the improvement of coating properties of the resulting coating solution, such as a fluorine atom-containing surfactant as disclosed in U.S. Pat. No. 4,822,713. The amount of the surfactant preferably ranges from 0.01 to 1% by weight and more preferably 0.05 to 0.5% by weight on the basis of the total weight of the composition.

The surface of the light-sensitive layer thus applied is preferably matted for the reduction of evacuation time during contact exposure using a vacuum printing frame and for preventing the blurring during printing. More specifically, the matting treatments are, for instance, a method for applying a matted layer as disclosed in J. P. KOKAI No. Sho 50-125805 and U.S. Pat. No. 4,288,526 and 4,626,484 and a method in which solid powder is heat welded onto the surface as disclosed in U.S. Pat. No. 5,028,512.

Developers for the light-sensitive composition used herein are preferably alkaline aqueous solutions substantially free of organic solvents and specific examples thereof include aqueous solutions of sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium carbonate, sodium bicarbonate, potassium carbonate, potassium bicarbonate and aqueous ammonia. The concentration of these alkalis ranges from 0.1 to 10% by weight, preferably 0.5 to 5% by weight.

Among these, those comprising alkali silicates such as potassium silicate, lithium silicate and sodium silicate are preferred since the resulting lithographic printing plate is free of background contamination. Moreover, the developer preferably comprises the alkali silicate having a molar ratio: [SiO$_2$]/[M], wherein [SiO$_2$] and [M] are the molar concentration of SiO, and the molar concentration of the total alkali metal, ranging from 0.5 to 2.5 and has an SiO$_2$, content ranging from 0.8 to 8% by weight.

The developer may further comprise, for instance, water-soluble sulfites such as sodium sulfite, potassium sulfite and magnesium sulfite; resorcin, methyl resorcin, hydroquinone and/or thiosalicylic acid. The amount of these compounds in the developer preferably ranges from 0.002 to 4% by weight and more preferably 0.01 to 1% by weight.

Components for developers usable in the invention further include water-soluble organic amine compounds. Examples thereof include monomethylamine, dimethylamine, trimethylamine, monoethylamine, diethylamine, triethylamine, monoisopropylamine, diisopropylamine, n-butylamine, monoethanolamine, diethanolamine, triethanolamine, monoisopropanolamine, diisopropanolamine, ethyleneamine, ethylenediamine and pyridine. Particularly preferred are, for instance, monoethanolamine, diethanolamine and triethanolamine which may likewise be used in combination with inorganic alkali metal salts.

The concentration of these basic compounds in the aqueous solutions preferably ranges from 0.05 to 10% by weight.

The pH value of the developer herein used is preferably not less than 12.

The developer preferably comprises at least one member selected from the group consisting of anionic and amphoteric surfactants as disclosed in J. P. KOKAI Nos. Sho 50-51324 and Sho 59-84241 and nonionic surfactants as disclosed in J. P. KOKAI Nos. Sho 59-75255, Sho 60-111246 and Sho 60-213943; or polymer electrolytes as disclosed in J. P. KOKAI Nos. Sho 55-95946 and Sho 56-142528 for improving, for instance, the wettability of the light-sensitive composition by the developer and the development stability (development latitude). The amount of these surfactants to be added preferably ranges from 0.001 to 2% by weight, in particular 0.003 to 0.5% by weight. Further, the alkali metal in the alkali metal silicate preferably comprises not less than 20 mole %, more preferably not less than 90 mole % and most preferably 100 mole % of potassium since based on the total alkali metal since insolubles are hardly formed in the developer.

A small amount of organic solvents may be added to the developer. Such organic solvents are selected from those having a solubility in water of not more than about 10% by weight, preferably not more than 5% by weight. Specific examples thereof include 1-phenylethanol, 2-phenylethanol, 3-phenylpropanol-1, 4-phenylbutanol-1, 4-phenylbutanol-2, 2-phenylbutanol-1, 2-phenoxyethanol, 2-benzyloxyethanol, o-methoxybenzyl alcohol, m-methoxybenzyl alcohol, p-methoxybenzyl alcohol, benzyl alcohol, cyclohexanol, 2-methylcyclohexanol, 4-methylcyclohexanol and 3-methylcyclohexanol.

The content of these organic solvents preferably ranges from 1 to 5% by weight on the basis of the total weight of the developer practically used. The content of the organic solvent is closely correlated with that of the surfactant and the amount of anionic surfactants is preferably increased with an increase in the content of the organic solvent. This is because, if the amount of the anionic surfactant is small and the amount of the organic solvent is great, the organic solvent is not sufficiently dissolved in the developer and thus good devolopability cannot be ensured.

In addition, the developer may optionally comprise a softener for hard water. Examples of softeners for hard water include polyphosphates such as $Na_2P_2O_7$, $Na_3P_3O_9$, $Na_2O_4P(NaO_3P)PO_3Na_2$, calgon (sodium polymetaphosphate); and aminopolycarboxylic acids and salts thereof such as ethylenediaminetetraacetic acid and potassium and sodium salts thereof, diethylenetriaminepentaacetic acid and potassium and sodium salts thereof, triethylenetetraminehexaacetic acid and potassium and sodium salts thereof, hydroxyethylethylenediaminetriacetic acid and potassium and sodium salts thereof, nitrilotriacetic acid and potassium and sodium salts thereof, 1,2-diaminocyclohexanetetraacetic acid and potassium and sodium salts thereof, and 1,3-diamino-2-propanoltetraacetic acid and potassium and sodium salts thereof. The optimum amount of these softeners for hard water varies depending on the hardness of water and quantity thereof used, but in general ranges from 0.01 to 5% by weight and preferably 0.01 to 0.5% by weight on the basis of the total weight of the developer practically used.

Further, the developer used in the invention may comprise a small amount of an organic solvent such as an alcohol, a chelating agent such as those disclosed in J. P. KOKAI No. Sho 58-190952, a metal salt as disclosed in J. P. KOKOKU No. Hei 1-30139, and/or an antifoaming agent such as an organic silane compound.

Light sources used in the exposure are, for instance, a carbon arc lamp, a mercury lamp, a xenon lamp, a tungsten lamp or a metal halide lamp.

It is a matter of course that the PS plate obtained from the light-sensitive composition of the invention can be subjected to plate-making processes as disclosed in J. P. KOKAI Nos. Sho 54-8002, Sho 55-115045 and Sho 59 58431. In other words, after development, the PS plate may be washed with water and then desensitized; desensitized without water washing; treated with an aqueous solution containing an acid; or treated with an aqueous solution containing an acid and then desensitized. In the development process of the PS plate of this kind, the alkaline aqueous solution is consumed in proportion to the quantity of the PS plate processed and the alkali concentration of the developer is correspondingly reduced, or when an automatic developing machine is operated over a long time of period, the alkali concentration of the developer is lowered due to the effect of carbon dioxide in the air. This leads to the reduction in the processing capacity of the developer. This problem, however, can be solved by recovering the processing capacity through addition of a replenisher such as described in J. P. KOKAI No. Sho 54 62004. In this respect, the addition of a replenisher is preferably performed in accordance with the method disclosed in U.S. Pat. No. 4,882,246. Moreover, the aforementioned plate-making process is preferably carried out using an automatic developing machine as disclosed in U.S. Pat. No. 4,952,958 and J. P. KOKAI No. Hei 2-32357.

When the PS plate according to the invention is imagewise exposed to light, developed and washed with water or rinsed and then unnecessary image areas are eliminated, it is preferred to use an elimination solution such as disclosed in U.S. Pat. No. 4,396,703. In addition, a desensitizing gum is optionally applied to the plate in the final step of plate-making processes. Preferred such desensitizing gums are those disclosed in, for instance, J. P. KOKOKU Nos. Sho 62-16834, Sho 62-25118 and Sho 63-52600 and J. P. KOKAI Nos. Sho 62-7595, Sho 62-11693 and Sho 62-83194.

Alternatively, when the PS plate of the invention obtained from the foregoing light-sensitive composition is imagewise exposed to light, developed, washed with water or rinsed, optionally subjected to an elimination treatment, washed with water and then subjected to burning, the plate is preferably subjected to a surface-conditioning treatment, prior to the burning treatment, with a surface-conditioning solution such as those disclosed in J. P. KOKOKU Nos. Sho 61-2518 and Sho 55-28062, J. P. KOKAI No. Sho 61-159655 and U.S. Pat. No. 4,762,771; 4,786,581 and 4,885,230.

The PS plate of the present invention can provide a lithographic printing plate having a low degree of remaining color stain on the non-image areas as compared with conventional PS plates and thus is excellent in plate-examination properties. Moreover, the resulting lithographic printing plate does not cause background contamination and has excellent properties such as high printing durability. It has been believed that the simultaneous solution of the problems of high degree of remaining color stain and low printing durability is very difficult, since the lithographic printing plates having a low degree of remaining color stain and free of background contamination have low printing durability, while those having high printing durability have a high degree of remaining color stain and easily cause background contamination.

However, the PS plate of the present invention can provide a lithographic printing plate not only having a low degree of remaining color stain and free of background contamination, but having high printing durability, which has never been anticipated conventionally.

The present invention will hereinafter be explained in more detail with reference to the following non-limitative working Examples and the effect practically achieved by the invention will also be discussed in detail in comparison with Comparative Examples given below.

In the following Examples and Comparative Examples, the term "%" means "% by weight" unless otherwise specified.

EXAMPLES 1 to 5, COMPARATIVE EXAMPLES 1 to 3

The surface of an aluminum plate having a thickness of 0.30 mm was grained with a nylon brush and an aqueous suspension of 400 mesh pumice stone and then washed with water sufficiently. After etching the aluminum plate by immersing it in a 10% aqueous solution of sodium hydroxide at 70° C,, for 60 seconds, it was washed with running water, neutralized and washed with a 20% $HNO_3$ solution and then washed with water. Then the plate was electrolytically surface-roughened in a 1% nitric acid aqueous solution at V A of 12.7 V such that the quantity of electricity at the anode time was 160 coulomb/$dm^2$, using a sinusoidal alternating waved current. At this stage, the surface roughness was determined and found to be 0.6 $\mu$ (Ra unit). Thereafter, the plate was desmutted by immersing in a 30% $H_2SO_4$ aqueous solution at 55° C. for 2 minutes and then anodized at a current density of 2 A/$dm^2$ in a 20% $H_2SO_4$ aqueous solution so that the amount of the resulting anodized layer was 2.7 g/$m^2$ to give Substrate (I).

Underlying coating Solution (A) having the following composition was applied onto the substrate (I) thus treated and dried at 80° C. for 30 seconds to give Substrate (II). The coated amount was 30 mg/$m^2$ (weighed after drying).

| Underlying Coating Solution (A) | |
|---|---|
| Component | Amount (g) |
| Phenylphosphonic acid | 0.15 |
| Methanol | 90 |
| Pure water | 10 |

Underlying coating solutions (B), (C), (D) and (E) were prepared by substituting ethylphosphonic acid, phenylphosphinic acid, diethylphosphinic acid and methylenediphosphonic acid for the phenylphosphonic acid in the underlying coating solution (A) and each was applied onto substrate (I) to give each corresponding substrate (III) to (VI).

By way of comparison, polyvinylphosphonic acid (weight-average molecular weight: 3,000) was dissolved in methanol and the resulting solution was applied onto substrate (I) so that the coated amount thereof was 30 mg/m$^2$ (weighed after drying) to give Substrate (vII).

Further, Substrate (vIII) was prepared in the same manner used above for preparing Substrate (I) except that the conditions for anodization were changed so that the thickness of the anodized layer was 0.5 g/m$^2$, for comparative purpose.

The following Light-sensitive solution (A) was applied onto Substrates (I) to (VIII) thus prepared to form light-sensitive layer so that the coated amount thereof was 2.5 g/m$^2$ (weighed after drying) to give the corresponding PS plates (I) to (VIII).

| Light-Sensitive Solution (A) | |
|---|---|
| Component | Amount (g) |
| Ester of 1,2-diazonaphthoquinone-5-sulfonyl chloride with a pyrogallol/acetone resin (described in Example 1 of U.S. Pat. No. 3,635,709) | 0.45 |
| Cresol/formaldehyde novolak resin (m-/p- ratio 6:4; weight-average molecular weight 3,000; number-average molecular weight 1,100) | 1.1 |
| 4-[P-N-(p-hydroxybenzoylamino)phenyl]-2,6-bis(trichloromethyl)-S-triazine | 0.02 |
| Tetrahydrophthalic anhydride | 0.05 |
| Victoria Pure Blue BOH (available from Hodogaya Chemical Co., Ltd.) | 0.02 |
| Megafack F-177 (fluorine atom-containing surfactant available from Dainippon Ink and Chemicals, Inc.) | 0.006 |
| Methyl ethyl ketone | 15 |
| 1-Methoxy-2-propanol | 15 |

The PS plates thus obtained were imagewise exposed to light from a 3 kW metal halide lamp for 50 seconds through a positive transparency at a distance of 1 m in a vacuum printing frame and then developed with a 5.26% aqueous solution (pH 12.7) of sodium silicate having an $SiO_2/Na_2O$ molar ratio of 1.74.

After the development, the plates were sufficiently washed with water, gummed up and then printing was performed in the usual manner. At this stage, the contamination of the non-image area, printing durability and extent of remaining color stain on the non-image area were determined. The results obtained are summarized in the following Table 1.

The results listed in Table 1 indicate that the PS plates of the present invention are excellent in all of the extent of remaining color stain on the non-image area, background contamination and printing durability as compared with those observed in Comparative Examples.

TABLE 1

| Ex. No. | PS Plate | Substrate | Remaining Color Stain[1] | Background Contamination[2] | Printing Durability[3] |
|---|---|---|---|---|---|
| 1 | (II) | (II) | 0.01 | o | 100,000 |
| 2 | (III) | (III) | 0.01 | o | 100,000 |
| 3 | (IV) | (IV) | 0.00 | o | 100,000. |

TABLE 1-continued

| Ex. No. | PS Plate | Substrate | Remaining Color Stain[1] | Background Contamination[2] | Printing Durability[3] |
|---|---|---|---|---|---|
| 4 | (V) | (V) | 0.01 | o | 100,000 |
| 5 | (VI) | (VI) | 0.01 | o | 100,000 |
| 1* | (I) | (I) | 0.05 | x | 100,000 |
| 2* | (VII) | (VII) | 0.00 | o | 50,000 |
| 3* | (VIII) | (VIII) | 0.02 | o | 80,000 |

[1] This value is expressed in terms of the difference ($\Delta D$) between the density of the non-image area after development and the density of the substrate prior to the coating.
[2] o: no contamination on the non-image area; x: the non-image area was contaminated.
[3] This property is expressed in terms of the number of copies practically acceptable.
*Comparative Example.

EXAMPLES 6 to 10, COMPARATIVE EXAMPLES 4 to 6

The same procedures used in Examples 1 to 5 and Comparative Examples 1 to 3 were repeated except that, in Light-sensitive solution (A), an ester (degree of esterification 45%) of 1,2-diazonaphthoquinone 4-sulfonyl chloride with an m-cresol/formaldehyde resin (weight average molecular weight: 2,000; number-average molecular weight 1,300) was used instead of the ester compound of 1,2-diazonaphthoquinone-5-sulfonyl chloride with a pyrogallol/acetone resin (Light-sensitive solution (B)). The results obtained are summarized in the following Table 2. The results listed in Table 2 indicate that the PS plates of the present invention are superior to those of Comparative Examples.

TABLE 2

| Ex. No. | PS Plate | Substrate | Remaining Color Stain*[1] | Background Contamination*[2] | Printing Durability*[3] |
|---|---|---|---|---|---|
| 6 | (IX) | (II) | 0.01 | o | 100,000 |
| 7 | (X) | (III) | 0.01 | o | 90,000 |
| 8 | (XI) | (IV) | 0.01 | o | 100,000 |
| 9 | (XII) | (V) | 0.01 | o | 90,000 |
| 10 | (XIII) | (VI) | 0.02 | o | 90,000 |
| 4* | (XIV) | (I) | 0.07 | x | 90,000 |
| 5* | (XV) | (VII) | 0.01 | o | 40,000 |
| 6* | (XVI) | (VIII) | 0.02 | o | 80,000 |

*[1] This value is expressed in terms of the difference ($\Delta D$) between the density of the non-image area after development and the density of the substrate prior to the coating.
*[2] o: no contamination on the non-image area; x: the non-image area was contaminated.
*[3] This property is expressed in terms of the number of copies practically acceptable.
*Comparative Example.

EXAMPLES 11 to 15, COMPARATIVE EXAMPLES 7 to 9

The surface of an aluminum plate having a thickness of 0.30 mm was grained with a nylon brush and an aqueous suspension of 400 mesh pumice stone and then washed with water sufficiently. After etching the aluminum plate by immersing it in a 10% aqueous solution of sodium hydroxide at 70° C. for 60 seconds, it was washed with running water, neutralized and washed with a 20% $HNO_3$ solution and then washed with water. Then the plate was electrolytically surface-roughened in a 1% nitric acid aqueous solution at V $\Lambda$ of 12.7 V such that the quantity of electricity at the anode time was 160 coulomb/dm$^2$, using a sinusoidal alternating waved current. At this stage, the surface roughness was determined and found to be 0.6 $\mu$ (Ra unit). Thereafter, the plate was desmutted by immersing in a 30% $H_2SO_4$ aqueous solution at 55° C. for 2 minutes and then anodized at a current density of 2 A/dm² in a 20% $H_2SO_4$ aqueous solution so that the thickness of the resulting anodized layer was 2.7 g/m² to give Substrate A. The same underlying coatings used in Examples 1 to 5 and Comparative Examples 1 to 3 were applied onto Substrate A thus obtained. Then the following Light-sensitive solution C was applied onto the substrate.

| Light-Sensitive Solution (C) | |
|---|---|
| Component | Amount (g) |
| Ester of 1,2-diazonaphthoquinone-5-sulfonyl chloride with a pyrogallol/acetone resin (described in Example 1 of U.S. Pat. No. 3,635,709) | 0.45 |
| Cresol/formaldehyde novolak resin (m-/p- ratio 6:4; weight-average molecular weight 3,000; number-average molecular weight 1,100) | 1.1 |
| 4-[p-N-(P-hydroxybenzoylamino)phenyl]-2,6-bis(trichloromethyl)-s-triazine | 0.02 |
| Tetrahydrophthalic anhydride | 0.05 |
| Victoria Pure Blue BOH (available from Hodogaya Chemical Co., Ltd.) | 0.02 |
| Megafack F-177 (fluorine atom-containing surfactant available from Dainippon Ink and Chemicals, Inc.) | 0.006 |
| Methyl ethyl ketone | 15 |
| 1-Methoxy-2-propanol | 15 |

The PS plates thus obtained were imagewise exposed to light from a kW metal halide lamp for 50 seconds through a positive transparency at a distance of 1 m in a vacuum printing frame and then developed with a 4.5% aqueous solution (pH 12.9) of sodium silicate having an $SiO_2/K_2O$ molar ratio of 1.5.

After the development, the plates were sufficiently washed with water, gummed up and then printing was performed in the same procedures used in Examples 1 to 5 and Comparative Examples 1 to 3. The results obtained are summarized in the following Table 3.

The results listed in Table 3 indicate that the PS plates of the present invention are superior to those of Comparative Examples.

time was 300 coulomb/dm² using a 60 Hz alternating rectangular-waved current. Then it was treated with a 5% aqueous solution of sodium hydroxide at 35° C. for 7 seconds. After water-washing, neutralizing with a 30% sulfuric acid aqueous solution for 40 seconds and then washing with water, the aluminum plate was anodized for 3 minutes at a current density of 2 A/dm² in a 15% sulfuric acid aqueous solution. Then it was immersed in a 2.5% aqueous solution of sodium silicate maintained at 50° C., washed with water and dried to give Substrate B for PS plates. The same underlying coatings used in Examples 1 to 5 and Comparative Examples 1 to 3 were applied onto Substrate B thus obtained. In this respect, the coatings were applied in the form of a solution in water/methanol (50 g/50 g: weight ratio) in an amount of 20 mg/m² (weighed after drying). Then the following Light-sensitive solution D was applied onto the substrates so that the coated amount thereof was 2 g/m² (dry weight) and then dried at 100° C. for 2 minutes to give a PS plates.

| Light-Sensitive Solution (D) | |
|---|---|
| Component | Amount (g) |
| Ester of 1,2-diazonaphthoquinone-5-sulfonyl chloride with a pyrogallol/acetone resin (described in Example 1 of U.S. Pat. No. 3,635,709) | 0.45 |
| Cresol/formaldehyde novolak resin (p-cresol/phenol ratio 6:4; weight-average molecular weight 3,000) | 0.30 |
| Cresol/formaldehyde novolak resin (m-/p- ratio 6:4; weight-average molecular weight 3,000) | 0.60 |
| Cresol/formaldehyde novolak resin (m-cresol 100%; weight-average molecular weight 2,000) | 0.02 |
| P-octylphenol/formaldehyde novolak resin | 0.008 |
| Tetrahydrophthalic anhydride | 0.03 |
| Naphthoquinone-1,2-diazido-4-sulfonyl chloride | 0.01 |
| Compound of formula: | 0.003 |

$(CH_3CH_2OCOCH_2)_2N$— 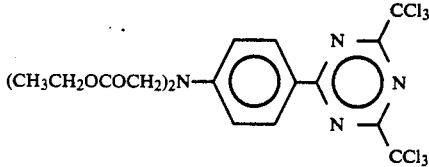

TABLE 3

| Ex. No. | Substrate | | | R.M.[4] During Printing | R.C.[5] Stain | Printing Durability |
|---|---|---|---|---|---|---|
| | A.T[1] | H.T[2] | U.C[3] | | | |
| 11 | o | o | phenylphosphate | not observed | 0.01 | 140,000 |
| 12 | o | o | phenylphosphonic acid | not observed | 0 02 | 140,000 |
| 13 | o | o | naphthylphosphate | not observed | 0.02 | 140,000 |
| 14 | o | o | phenylphosphinic acid | not observed | 0.02 | 140,000 |
| 15 | o | o | diphenylphosphinic acid | not observed | 0.01 | 140,000 |
| 7* | o | o | none | not observed | 0.03 | <10,000 |
| 8* | o | x | phenylphosphate | hardly observed | 0.04 | 120,000 |
| 9* | o | x | none | slightly observed | 0.05 | 150,000 |

[1]o: Anodization treated
[2]o: hydrophilized, x: not hydrophilized
[3]hydrophilic compound contained in underlying coating;
[4]retouching mark;
[5]remaining color:
*Comparative Example.

EXAMPLES 16 to 20, COMPARATIVE EXAMPLES

An aluminum plate of an Al-Mn-Mg alloy (A.A. 3005) having a thickness of 0.3 mm was etched by immersing it in a 10% sodium hydroxide solution at 70° C. for 40 seconds, then washed with running water, neutralized and washed with a 30% $H_2SO_4$ aqueous solution for 40 seconds and then washed with water. The plate was electrolytically surface-roughened in a 1% aqueous nitric acid solution at a current density of 30 A/dm² so that the quantity of electricity at the anode

| | |
|---|---|
| 4-[P-N-(p-hydroxybenzoyl)aminophenyl]-2,6-bis(trichloromethyl)-s-triazine | 0.012 |
| Victoria Pure Blue BOH.naphthalenesulfonate (available from Hodogaya Chemical Co., Ltd.) | 0.02 |
| Methyl ethyl ketone | 4.7 |
| 1-Methoxy-2-propanol | 4.4 |
| Diethylene glycol dimethyl ether | 0.4 |
| Fluorine atom-containing surfactant (described in Example 1 of U.S. Pat. No. 4,822,713) | 0.003 |

The PS plates thus obtained were imagewise exposed to light from a 3 kW metal halide lamp for 50 sec through a positive transparency at a distance of 1 m in a vacuum printing frame and then developed with a 3% aqueous solution of potassium silicate having an $SiO_2/K_2O$ molar ratio of 1.0.

After the development, the plates were sufficiently washed with water and gummed up. Then printing was performed in the same procedures used in Examples 1 to 5 and Comparative Examples 1 to 3. The results obtained are summarized in the following Table 4. The results listed in Table 4 indicate that the PS plates of the present invention are superior to those of Comparative Examples.

TABLE 4

| Ex. No. | Substrate A.T[1] | H.T[2] | U.C[3] | R.M.[4] During Printing | R.C.[5] Stain | Printing Durability |
|---|---|---|---|---|---|---|
| 16 | o | o | phenylphosphate | not observed | 0.02 | 200,000 |
| 17 | o | o | phenylphosphonic acid | not observed | 0.01 | 200,000 |
| 18 | o | o | naphthylphosphate | not observed | 0.01 | 200,000 |
| 19 | o | o | phenylphosphinic acid | not observed | 0.01 | 200,000 |
| 20 | o | o | diphenylphosphinic acid | not observed | 0.02 | 200,000 |
| 10* | o | o | none | not observed | 0.04 | 130,000 |
| 11* | o | x | phenylphosphate | hardly observed | 0.02 | 180,000 |
| 12* | o | x | none | slightly observed | 0.06 | 200,000 |

[1]o: Anodization treated
[2]o: hydrophilized, x: not hydrophilized
[3]hydrophilic compound contained in underlying coating;
[4]retouching mark;
[5]remaining color:
*Comparative Example.

What is claimed is:

1. A presensitized plate for use in making a lithographic printing plate comprising an aluminum plate which is surface-roughened and then anodized so that the amount of an anodized layer formed is not less than 1.0 g/m$^2$; a hydrophilic layer which is applied onto the anodized layer; and, on the hydrophilic layer, a positive working photosensitive layer comprising an o-quinone diazide compound and an alkaline water-soluble resin as a binder, wherein the hydrophilic layer comprises at least one compound selected from the group consisting of phenylphosphonic acid, p-nitrophenylphosphonic acid, p-methoxyphenylphosphonic acid, p-hydroxyphenylphosphonic acid, p-tolylphosphonic acid, p-acetylphenylphosphonic acid, p-cyanophenylphosphonic acid, m-chlorophenylphosphonic acid, methylethylphosphonic acid, ethylphosphonic acid, 2-carboxyethylphosphonic acid, 2-phenylethylphosphonic acid, 2-hydroxyethylphosphonic acid, 2-methyoxyethylphosphonic acid, 2-acetylethylphosphonic acid, 2-chloroethylphosphonic acid, phenylphosphinic acid, p-nitrophenylphosphinic acid, p-methoxyphenylphosphinic acid, p-hydroxyphenylphosphinic acid, p-tolylphosphinic acid, p-acetylphenylphosphinic acid, p-cyanophenylphosphinic acid, m-chlorophenylphosphinic acid, methylphosphinic acid, ethylphosphinic acid, 2-carboxyethylphosphinic acid, 2-phenylethylphosphinic acid, 2-hydroxyethylphosphinic acid, 2-methoxyethylphosphinic acid, 2-acetylethylphosphinic acid, 2-chloroethylphosphinic acid, dimethylphosphinic acid, diethylphosphinic acid and diphenylphosphinic acid.

2. The presensitized plate of claim 1 wherein the surface-roughening treatment of the aluminum plate is performed by a mechanical surface-roughening method, a method for electrolytically dissolving the surface, a method for selectively and chemically dissolving the surface or a combination thereof.

3. The presensitized plate of claim 1 wherein the anodization treatment of the aluminum plate is performed in an electrolyte selected from the group consisting of sulfuric acid, phosphoric acid, oxalic acid, chromic acid and mixture thereof.

4. The presensitized plate of claim 1 wherein the anodization is carried out at an electrolyte concentration ranging from 1 to 80% by weight, an electrolyte temperature ranging from 5° to 70° C., a current density ranging from 5 to 60 A/dm$^2$, a voltage ranging from 1 to 100 V and electrolysis time ranging from 10 seconds to 50 minutes.

5. The presensitized plate of claim 1 wherein the amount of the anodized layer ranges from 2.0 to 6.0 g/m$^2$.

6. The presensitized plate of claim 1 wherein said at least one compound is selected from the group consisting of phenylphosphonic acid, naphthylphosphonic acid, phenylphosphinic acid, diphenylphosphinic acid and naphthylphosphinic acid.

7. The presensitized plate of claim 1 wherein the coated amount of the hydrophilic layer ranges from 2 to 200 mg/m$^2$.

8. The presensitized plate of claim 7 wherein the coated amount of the hydrophilic layer ranges from 10 to 60 mg/m$^2$.

9. The presensitized plate of claim 1 wherein the hydrophilic layer further comprises a hydrophilic compound selected from the group consisting of carboxymethyl cellulose, dextrin, gum arabic, 2-aminoethylphosphonic acid, glycine, β-alanine and triethanolamine hydrochloride.

10. The presensitized plate of claim 1 wherein the alkaline water-soluble resin is selected from the group consisting of phenol/formaldehyde resin, m-cresol/formaldehyde resin, p-cresol/formaldehyde resin, o-cresol/formaldehyde resin, m-/-p-mixed cresol/formaldehyde resin, phenol/m-/p-/o- or m-/p- or m-/o-mixed cresol/formaldehyde resin, phenol-modified xylene resin, polyhydroxystyrene, halogenated polyhydroxystyrene, acrylic resins having phenolic hydroxyl groups, acrylic resins having sulfonamido groups and urethane resins.

11. The presensitized plate of claim 1 wherein the light-sensitive composition comprises at least one additive selected from the group consisting of cyclic acid anhydrides, phenols, organic acids, nonionic surfactants, amphoteric surfactants, printing out agents, dyes and fillers.

12. A method for preparing a lithographic printing plate comprising the step of developing an imagewise exposed presensitized plate as set forth in claim 1 with an aqueous solution of a silicate having a pH of not less than 12.

13. A presensitized plate for use in making a lithographic printing plate comprising an aluminum plate which is anodized and then hydrophilized; a hydrophilic layer which is formed on the aluminum plate; and, on the hydrophilic layer, a positive working photosensitive layer comprising an o-quinone diazide compound and an alkaline water-soluble resin as a binder, wherein the hydrophilic layer comprises at least one compound selected from the group consisting of phenylphosphonic acid, phenylphosphate, naphthylphosphonic acid, naphthylphosphate, glycerophosphonic acid, glycerophosphate, p-nitrophenylphosphonic acid, p-nitrophenylphosphate, p-methoxyphenylphosphonic acid, p-methoxyphenylphosphate, p-hydroxyphenylphosphonic acid, p-hydroxyphenylphosphate, p-tolylphosphonic acid, p-tolylphosphate, p-acetylphenylphosphonic acid, p-acetylphenylphosphate, p-cyanophenylphosphonic acid, p-cyanophenylphosphate, m-chlorophenylphosphonic acid, m-chlorophenylphosphate, methylphosphonic acid, methylenediphosphonic acid, ethylphosphonic acid, ethylenediphosphonic acid, 2-carboxyethylphosphonic acid, phosphonoacetic acid, 2-phenylethylphosphonic acid, 2-hydroxyethylphosphonic acid, 1-hydroxyethane-1,1-diphosphonic acid, aminohexylphosphate, 2-methoxyethylphosphonic acid, 2-acetylethylphosphonic acid, glycine-N,N-bis(methylenephosphonic acid), phosphoserine, phosphothreonine, pyridoxal phosphate, phenylphosphinic acid, naphthylphosphinic acid, diphenylphosphinic acid, dimethylphosphinic acid, p-nitrophenyl-phosphinic acid, p-methoxyphenylphosphinic acid, p-hydroxyphenylphosphinic acid, p-tolylphosphinic acid, p-acetylphenylphosphinic acid, bisnitrophenylphosphate, dioctyl phosphate, diisopropyl phosphate, dibutylphosphate, dimethyl phosphate, diethyl phosphate, di-2-ethylhexylphosphate, diphenyl phosphate, methylphosphinic acid, ethylphosphinic acid, diethylphosphinic acid, 2-carboxyethylphosphinic acid, 2-phenylethylphosphinic acid, 2-hydroxyethylphosphinic acid, 2-methoxyethylphosphinic acid and 2-acetylethylphosphinic acid.

14. The presensitized plate of claim 13 wherein the hydrophilization treatment is a treatment with an alkali metal silicate, a potassium fluorozirconate or a polyvinylphosphonic acid.

15. The presensitized plate of claim 14 wherein the hydrophilization treatment is a treatment with an alkali metal silicate.

16. The presensitized plate of claim 13 wherein said at least one compound is selected from the group consisting of phenylphosphonic acid, phenylphosphate, naphthylphosphonic acid, naphthylphosphate, phenylphosphinic acid, diphenylphosphinic acid and naphthylphosphinic acid.

* * * * *